(12) United States Patent
Tai et al.

(10) Patent No.: US 12,183,746 B2
(45) Date of Patent: Dec. 31, 2024

(54) DISPLAY DEVICE

(71) Applicant: Innolux Corporation, Miao-Li County (TW)

(72) Inventors: Ming-Jou Tai, Miao-Li County (TW); Chia-Hao Tsai, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 18/306,975

(22) Filed: Apr. 25, 2023

(65) Prior Publication Data

US 2023/0268354 A1 Aug. 24, 2023

Related U.S. Application Data

(63) Continuation of application No. 17/306,964, filed on May 4, 2021, now Pat. No. 11,676,973.

(30) Foreign Application Priority Data

May 26, 2020 (CN) .......................... 202010457622.2

(51) Int. Cl.
 *H01L 27/12* (2006.01)
(52) U.S. Cl.
 CPC ........ *H01L 27/124* (2013.01); *H01L 27/1237* (2013.01)

(58) Field of Classification Search
 CPC ..................................................... H01L 27/124
 See application file for complete search history.

(56) References Cited

U.S. PATENT DOCUMENTS

| | | | | |
|---|---|---|---|---|
| 2002/0060756 A1* | 5/2002 | Kurashina | ......... | G02F 1/136213 349/39 |
| 2004/0141097 A1* | 7/2004 | Takahara | .......... | G02F 1/136213 349/110 |
| 2010/0230763 A1* | 9/2010 | Sun | .................... | H01L 27/14692 438/164 |
| 2020/0264484 A1* | 8/2020 | Jinnai | .................... | G02F 1/1368 |
| 2021/0124196 A1* | 4/2021 | Miyamoto | ........ | G02F 1/136286 |

* cited by examiner

*Primary Examiner* — Sang V Nguyen
(74) *Attorney, Agent, or Firm* — JCIPRNET (57) ABSTRACT

An electronic device includes a substrate, a scan line, a transistor, a first insulating layer, a pad, a second insulating layer, and an electrode. The scan line is disposed on the substrate and extends in a first direction. The transistor is disposed on the substrate and includes a drain. The first insulating layer is disposed on the transistor and includes a first contact hole. The pad is disposed on the first insulating layer and adjacent to the scan line, and the pad contacts the drain through the first contact hole. The second insulating layer is disposed on the pad and includes a second contact hole. The electrode is disposed on the second insulating layer and contacts the pad through the second contact hole. The pad overlaps the first contact hole and second contact hole continuously in a direction perpendicular to the first direction.

8 Claims, 8 Drawing Sheets

DISPLAY DEVICE

CROSS-REFERENCE TO RELATED APPLICATION

This application is a continuation application of and claims the priority benefit of a prior application Ser. No. 17/306,964, filed on May 4, 2021. The prior application Ser. No. 17/306,964 claims the priority benefit of Chinese patent application serial no. 202010457622.2, filed on May 26, 2020. The entirety of each of the above-mentioned patent applications is hereby incorporated by reference herein and made a part of this specification.

BACKGROUND

Field of the Disclosure

The disclosure relates to a display device, and more particularly to a display device that can increase electron transmission between a pixel electrode and a drain.

Description of Related Art

Flat display panels have been widely applied to electronic devices such as mobile phones, televisions, monitors, tablet computers, car displays, wearable devices, and desktop computers. With the vigorous development of electronic products, the requirements for display quality of electronic products are higher and higher, and therefore improvement has been made constantly to the electronic devices for display to achieve the display effect of greater and higher resolution.

SUMMARY OF THE DISCLOSURE

The disclosure provides a display device that can improve and stabilize the electron transmission between the pixel electrode and the drain.

An electronic device includes a substrate, a scan line, a transistor, a first insulating layer, a pad, a second insulating layer, and an electrode. The scan line is disposed on the substrate and extends in a first direction. The transistor is disposed on the substrate and includes a drain. The first insulating layer is disposed on the transistor and includes a first contact hole. The pad is disposed on the first insulating layer and adjacent to the scan line, and the pad contacts the drain through the first contact hole. The second insulating layer is disposed on the pad and includes a second contact hole. The electrode is disposed on the second insulating layer and contacts the pad through the second contact hole. The pad overlaps the first contact hole and second contact hole continuously in a direction perpendicular to the first direction.

In order to make the above-mentioned features and advantages of the disclosure more obvious and comprehensible, the embodiments are described below with reference to the accompanying drawings for detailed description as follows.

DESCRIPTION OF EMBODIMENTS

The disclosure can be understood by referring to the following detailed description in combination with the accompanying drawings. It should be noted that in order to make it easy for the reader to understand and for the simplicity of the drawings, the multiple drawings in this disclosure only depict a part of the electronic device, and the specific elements in the drawings are not drawn according to actual scale. In addition, the number and size of each element in the drawings are only for exemplary purpose, and are not intended to limit the scope of the disclosure.

In the following description and claims, the terms "contain" and "include" are open-ended terms, so they should be interpreted as "include but not limited to . . . ".

It should be understood that when an element or layer is referred to as being "on" or "connected to" another element or layer, it can be directly set on said other element or layer or directly connected to said other element or layer, or there is an intervening element or layer between the two (indirect connection). In contrast, when an element is referred to as being "directly on" or "directly connected to" another element or layer, there are no intervening elements or layers between the two.

Although the terms first, second, third . . . can be used to describe a variety of elements, the elements are not limited by this term. This term is only used to distinguish a single element from other elements in the specification. Different terminologies may be adopted in claims, and replaced with the first, second, third . . . in accordance with the order of elements specified in the claims. Therefore, in the following description, the first element may be described as the second element in the claims.

In some embodiments of the disclosure, terms such as "connect" and "interconnect" with respect to bonding and connection, unless specifically defined, may refer to two structures that are in direct contact with each other, or may refer to two structures that are indirectly in contact with each other, wherein there are other structures set between these two structures. In addition, the terms that describe joining and connecting may apply to the case where both structures are movable or both structures are fixed. In addition, the term "coupling" involves any direct and indirect electrical connection means.

In the disclosure, the length and width can be measured by using an optical microscope, and the thickness can be measured based on a cross-sectional image in an electron microscope, but not limited to this. In addition, any two values or directions used for comparison may have certain errors.

The electronic device of the disclosure may include a display device, an antenna device, a sensing device, a touch display, a curved display or a free shape display, but not limited thereto. The electronic device may be a bendable or flexible electronic device. The electronic device may include, for example, light-emitting diodes, liquid crystal, fluorescence, phosphor, other suitable display media, or a combination of the foregoing, but not limited thereto. The light-emitting diodes may include, for example, organic light-emitting diodes (OLED), inorganic light-emitting diodes (LED), mini light-emitting diodes (mini LED), micro light-emitting diodes (micro LED) or quantum dot (QD) light-emitting diodes (QLED or QDLED), or other suitable materials or any combination of the above, but not limited thereto. The display device may include, for example, a spliced display device, but not limited thereto. The antenna device may be, for example, a liquid crystal antenna, but not limited thereto. The antenna device may include, for example, an antenna spliced device, but not limited thereto. It should be noted that the electronic device may be any combination of the foregoing, but not limited thereto. In addition, the electronic device may be in a rectangular shape, a circular shape, a polygonal shape, a shape with curved edges, or other suitable shapes. The electronic device may have peripheral systems such as a driving system, a control system, a light source system, a shelf system, etc. to support the display device, the antenna device, or the spliced device. The disclosure will be explained below with reference to a display device, but this disclosure is not limited thereto.

It should be noted that, the embodiments listed below can replace, recombine, and mix features in several different embodiments to achieve other embodiments without departing from the principle of the disclosure. As long as the features in different embodiments are not against or in conflict with the principle of the disclosure, they can be mixed and used freely.

Reference will now be made in detail to exemplary embodiments of the disclosure, examples of which are illustrated in the accompanying drawings. Wherever possible, the same element symbols are used in the drawings and description to denote the same or similar parts.

Figure 1A:
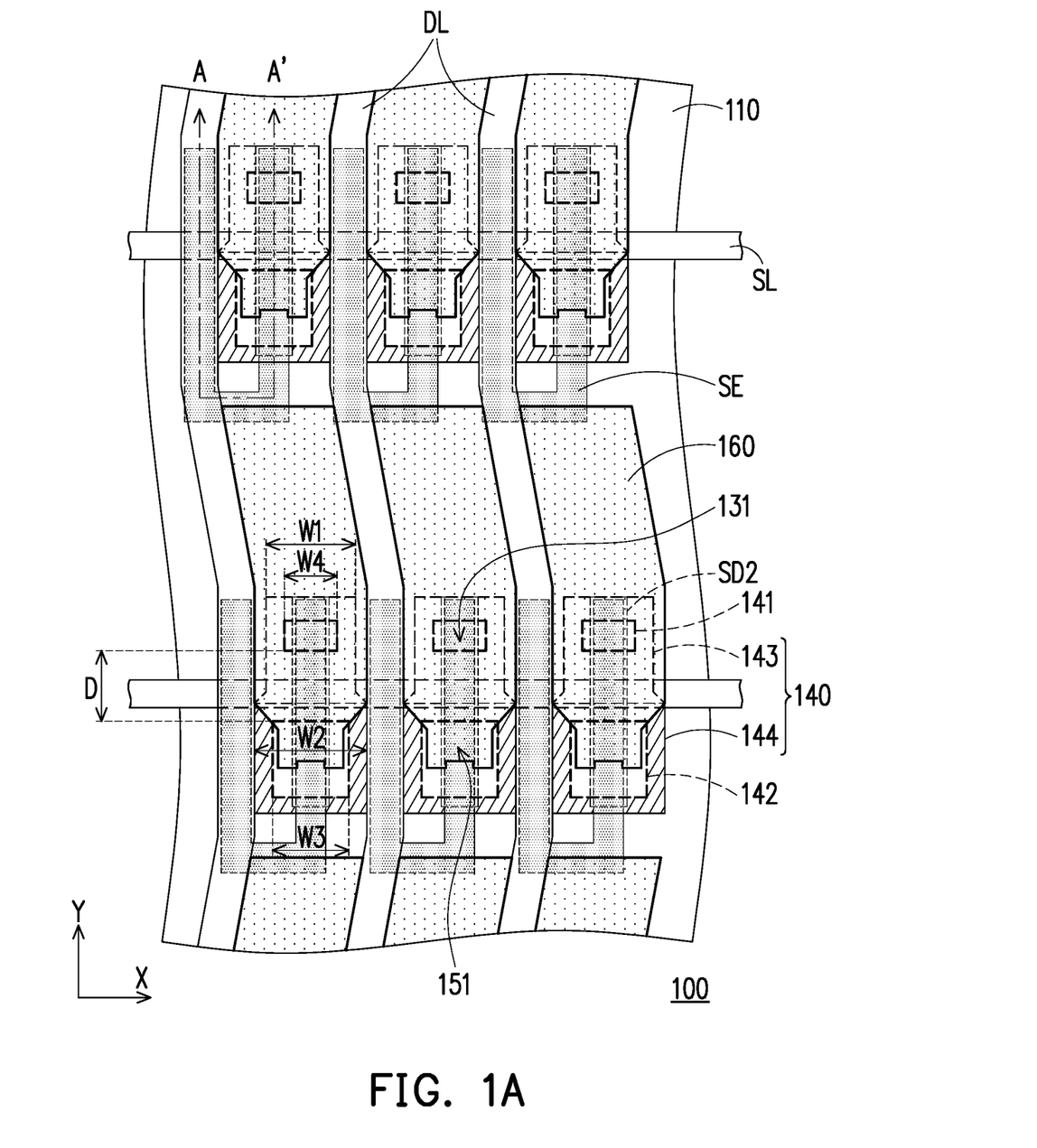
FIG. 1A is a schematic top view of a display device according to an embodiment of the disclosure.
Figure 1B:
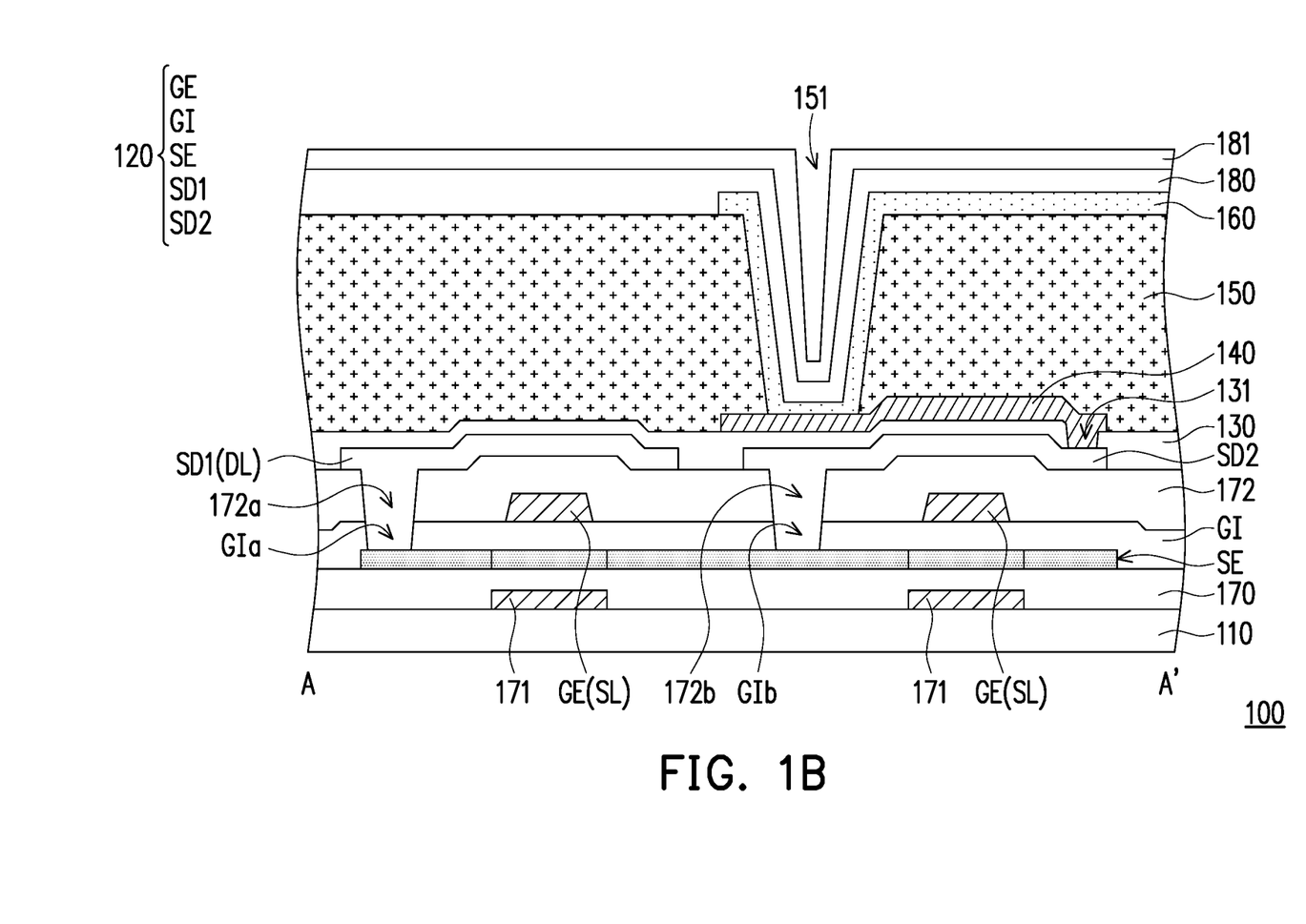
FIG. 1B is a schematic cross-sectional view of the display device of FIG. 1A taken along section line A-A'.

FIG. 1A is a schematic top view of a display device according to an embodiment of the disclosure. FIG. 1B is a schematic cross-sectional view of the display device of FIG. 1A taken along section line A-A'. For the clarity of drawings and convenience of description, FIG. 1A omits the illustration of some elements in the display device.

Referring to FIG. 1A and FIG. 1B, the display device 100 of the embodiment includes a substrate 110, a transistor 120, a first insulating layer 130, a transfer pad 140, a second insulating layer 150, and a pixel electrode 160. In the embodiment, the substrate 110 may include a rigid substrate or a flexible substrate. For example, the material of the substrate 110 may include glass, quartz, sapphire, ceramic, polycarbonate (PC), polyimide (PI), polyethylene terephthalate (PET), other suitable substrate materials, or a combination of the foregoing, but not limited thereto.

The transistor 120 is disposed on the substrate 110, and the transistor 120 includes a gate GE, a gate insulating layer GI, a semiconductor layer SE, a source SD1 and a drain SD2, but not limited thereto. In the embodiment, the gate insulating layer GI may have openings GIa and GIb to expose a part of the semiconductor layer SE. In some embodiment, the semiconductor layer SE has a bent portion. In some embodiment, the semiconductor layer SE has a U-shaped portion. In some embodiments, the materials of the source SD1 and/or the drain SD2 may include transparent conductive materials or non-transparent conductive materials, such as indium tin oxide, indium zinc oxide, indium oxide, zinc oxide, tin oxide, metal materials (such as aluminum, molybdenum, copper, silver, etc.), other suitable materials or a combination of the above, but not limited thereto. In some embodiments, the material of the semiconductor layer SE may include amorphous silicon, low temperature polysilicon (LTPS), metal oxide (e.g., indium gallium zinc oxide IGZO), other suitable materials, or a combination of the above, but not limited thereto. In the embodiment, although the gate GE of the transistor 120 is a top gate structure, this disclosure is not limited thereto. That is to say, in other embodiments, the gate of the transistor may also be a bottom gate structure. In addition, in the schematic top view of this embodiment, the display device 100 further includes a scan line SL and a read line DL. The scan line SL and the read line DL are disposed on the substrate 110, and the scan line SL extends along a direction X, and the read line DL extends along a direction Y, wherein the direction X is different from the direction Y. Since the gate GE of the transistor 120 can be electrically connected to the scan line SL, and the source SD1 of the transistor 120 can be electrically connected to the read line DL, the transistor 120 can be electrically connected to the scan line SL and the read line DL respectively. In some embodiment, the semiconductor layer SE a portion of the semiconductor layer SE is overlapped with the read line DL.

In the embodiment, the display device 100 further includes a buffer layer 170, a shielding layer 171, and a dielectric layer 172. The buffer layer 170 and the shielding layer 171 are disposed between the transistor 120 and the substrate 110, and the shielding layer 171 is disposed corresponding to the gate GE. The dielectric layer 172 is disposed between the source SD1 (or the drain SD2) and the gate insulating layer GI to cover the gate GE and the gate insulating layer GI. The dielectric layer 172 may have openings 172a and 172b, wherein the opening 172a communicates with the opening GIa to expose a part of the semiconductor layer SE, and the opening 172b communicates with the opening GIb to expose a part of the semiconductor layer SE.

In the embodiment, the source SD1 and the drain SD2 are respectively disposed on the dielectric layer 172. The source SD1 can also be filled in the opening 172a of the dielectric layer 172 and the opening GIa of the gate insulating layer GI, so that the source SD1 can be electrically connected to the semiconductor layer SE. The drain SD2 can also be filled in the opening 172b of the dielectric layer 172 and the opening hole GIb of the gate insulating layer GI, so that the drain SD2 can be electrically connected to the semiconductor layer SE.

The first insulating layer 130 is disposed on the transistor 120. The first insulating layer 130 covers the source SD1, the drain SD2, and the dielectric layer 172. The first insulating layer 130 and the substrate 110 are respectively disposed on opposite sides of the transistor 120. The first insulating layer 130 includes a first contact hole 131, and the first contact hole 131 exposes a part of the drain SD2.

The transfer pad 140 is disposed on the first insulating layer 130 and located between the pixel electrode 160 and the drain SD2. The transfer pad 140 is adjacent to the scan line SL. The transfer pad 140 can also be filled in the first contact hole 131 of the first insulating layer 130, so that the transfer pad 140 can be electrically connected to the drain SD2. In the embodiment, the transfer pad 140 is disposed corresponding to the drain SD2. The orthographic projection of the transfer pad 140 on the substrate 110 overlaps the orthographic projection of the drain SD2 on the substrate 110, and the orthographic projection of the transfer pad 140 on the substrate 110 is greater than the orthographic projection of the drain SD2 on the substrate 110. In the top view of the display device 100 (as shown in FIG. 1A), the area of the transfer pad 140 is larger than the area of the drain SD2. In the embodiment, the material of the transfer pad 140 may include metal materials (such as aluminum, molybdenum, copper, silver, etc.), other suitable materials, or a combination of the foregoing, but not limited thereto.

The second insulating layer 150 is disposed on the transfer pad 140. The second insulating layer 150 covers the transfer pad 140 and the first insulating layer 130. The second insulating layer 150 and the transistor 120 are respectively disposed on opposite sides of the first insulating layer 130. The second insulating layer 150 includes a second contact hole 151, and the second contact hole 151 exposes a part of the transfer pad 140.

The pixel electrode 160 is disposed on the second insulating layer 150, and located between the third insulating layer 180 and the second insulating layer 150. The pixel electrode 160 can also be filled in the second contact hole 151, so that the pixel electrode 160 can be electrically connected to the transfer pad 140. The orthographic projection of the pixel electrode 160 on the substrate 110 overlaps the orthographic projection of the transfer pad 140 on the substrate 110.

In the top view of the display device 100, the transfer pad 140 has a first contact region 141 and a second contact region 142. The first contact region 141 is provided corresponding to the first contact hole 131 of the first insulating layer 130. The second contact region 142 is provided corresponding to the second contact hole 151 of the second insulating layer 150. Specifically, the portion where the transfer pad 140 is filled in the bottom of the first contact hole 131 can be regarded as the first contact region 141 of the transfer pad 140. The transfer pad 140 has a first contact area in the first contact region 141, and the part of the transfer pad 140 exposed from the bottom of the second contact hole 151 can be regarded as the second contact region 142 of the transfer pad 140. The transfer pad 140 has a second contact area in the second contact region 142. In the embodiment, the area of the first contact region 141 may be equal to the area of the first contact hole 131, and the area of the second contact region 142 may be equal to the area of the second contact hole 151, but not limited thereto. Therefore, the transfer pad 140 can contact the drain SD2 through the first contact hole 131 through the first contact region 141, and the pixel electrode 160 can contact the transfer pad 140 through the second contact hole 151 through the second contact region 142. That is, the pixel electrode 160 can be electrically connected to the drain SD2 through the second contact region 142 and the first contact region 141 of the transfer pad 140. In addition, in this embodiment, in the top view of the display device 100 (as shown in FIG. 1A), since the second contact area of the transfer pad 140 is larger than the first contact area of the transfer pad 140, the configuration of the second contact region 142 can increase the contact area between the pixel electrode 160 and the transfer pad 140. In this manner, the pixel electrode 160 can improve and stabilize the electron transmission between the pixel electrode 160 and the drain SD2 through the second contact region 142 of the transfer pad 140.

In the embodiment, in the top view of the display device 100 (as shown in FIG. 1A), there is a distance D between the first contact hole 131 of the first insulating layer 130 and the second contact hole 151 of the second insulating layer 150, and the first contact hole 131 of the first insulating layer 130 does not overlap the second contact hole 151 of the second insulating layer 150. In addition, in the embodiment, the gate GE of the transistor 120 may be located between the first contact hole 131 of the first insulating layer 130 and the second contact hole 151 of the second insulating layer 150, but not limited thereto.

In the embodiment, in the top view of the display device 100 (as shown in FIG. 1A), the transfer pad 140 overlaps the first contact hole 131 and second contact hole 151 continuously in the direction Y perpendicular to the direction X, and the transfer pad 140 further includes a first portion 143 corresponding to the first contact hole 131 and a second portion 144 corresponding to the second contact hole 151. Specifically, in the top view of the display device 100 (as shown in FIG. 1A), the transfer pad 140 includes the first contact region 141 formed by the transfer pad 140 filled in the first contact hole 131 as well as the first portion 143 surrounding the first contact region 141, and the second contact region 142 formed by the part of the transfer pad 140 exposed by the second contact hole 151 as well as the second portion 144 surrounding the second contact region 142. Specifically, the width W1 of the first portion 143 may be smaller than the width W2 of the second portion 144, but not limited thereto. In the embodiment, in the top view of the display device 100 (as shown in FIG. 1A), when the width W1 of the first portion 143 of the transfer pad 140 is smaller than the width W2 of the second portion 144 of the transfer pad 140, specifically, the first portion 143 and the second portion 144 of the transfer pad 140 of this embodiment may be located on different sides of the scan line SL, and the width W1 of the first portion 143 is smaller than the width W2 of the second portion 144, forming a contour with a gourd shape to reduce cross-talk between the transfer pad 140 and the source SD1 but not limited thereto. In addition, in the top view of the display device 100 (as shown in FIG. 1A), the width W2 of the second portion 144 of the transfer pad 140 may be greater than the width W3 of the second contact hole 151, and the width W1 of the first portion 143 of the transfer pad 140 may be larger than the width W4 of the first contact hole 131. In this embodiment, the width W1 of the first portion 143, the width W2 of the second portion 144, the width W3 of the second contact hole 151, and the width W4 of the first contact hole 131 are, for example, measured along the substantial extending direction (i.e., direction X) of the scan line SL.

In the embodiment, the display device 100 further includes a third insulating layer 180 and a common electrode 181. The third insulating layer 180 is disposed on the pixel electrode 160 and in the second contact hole 151. The common electrode 181 is disposed on the third insulating layer 180 and the second contact hole 151 so that the third insulating layer 180 is located between the common electrode 181 and the pixel electrode 160.

In short, in the top view of the display device 100 of this embodiment, since the pixel electrode 160 can contact the second contact region 142 of the transfer pad 140, and the first contact region 141 of the transfer pad 140 can contact the drain SD2, the pixel electrode 160 can be electrically connected to the drain SD2 through the second contact region 142 and the first contact region 141 of the transfer pad 140. In addition, since the second contact region 142 of the transfer pad 140 is larger than the first contact region 141, the contact area between the pixel electrode 160 and the transfer pad 140 can be increased. In this manner, the pixel electrode 160 can improve and stabilize the electron transmission between the pixel electrode 160 and the drain SD2 through the second contact region 142 of the transfer pad 140, thereby reducing the resistance between the pixel electrode 160 and the drain SD2.

Other embodiments are provided below for explanation. It should be noted here that the following embodiments adopt the reference numbers and partial contents of the foregoing embodiments, wherein the same reference numbers are used to indicate the same or similar elements, and the description of the same technical content is omitted. For the description of the omitted parts, reference may be made to the foregoing embodiments, and the same content will not narrated in the following embodiments.

Figure 2A:
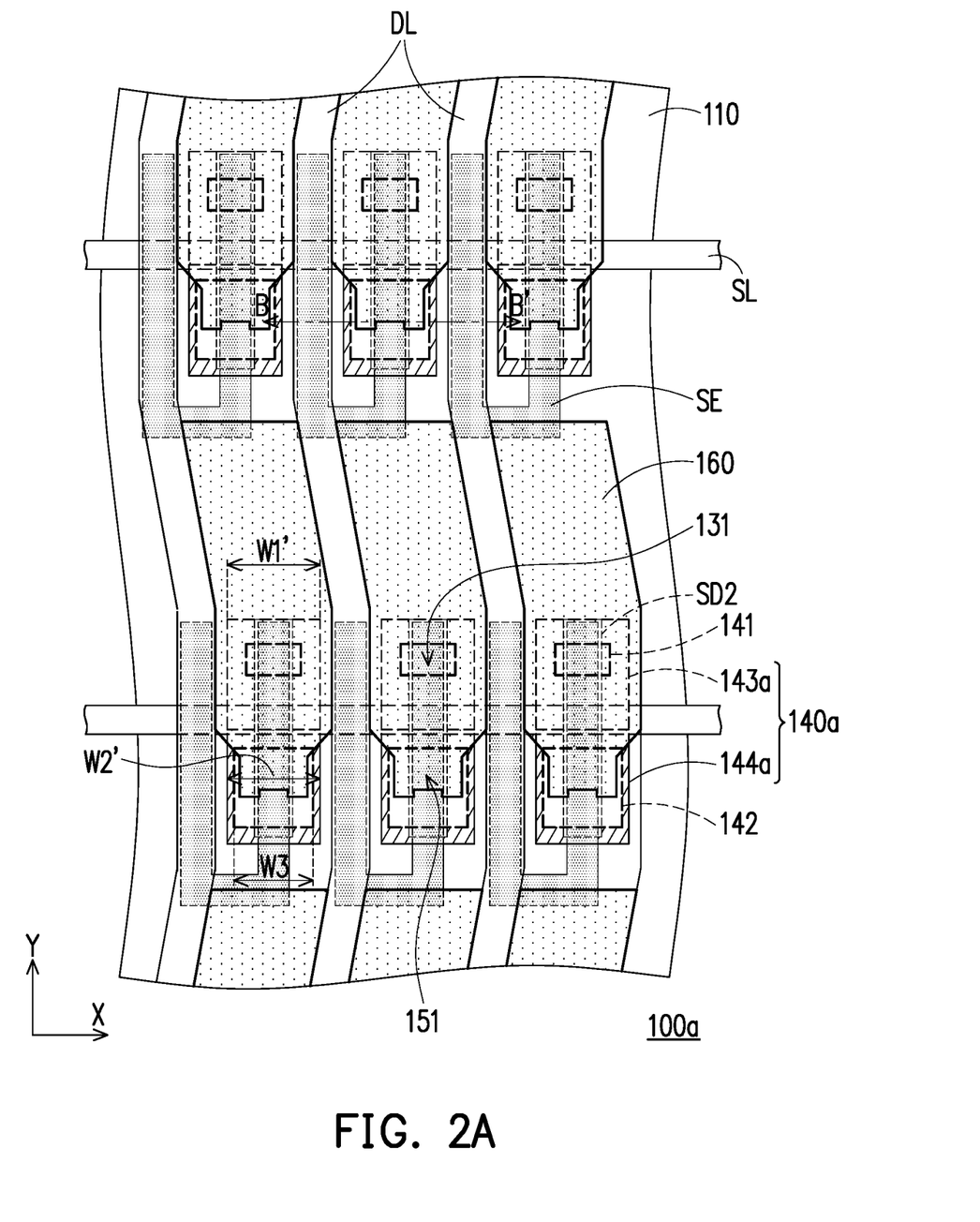
FIG. 2A is a schematic top view of a display device according to another embodiment.
Figure 2B:
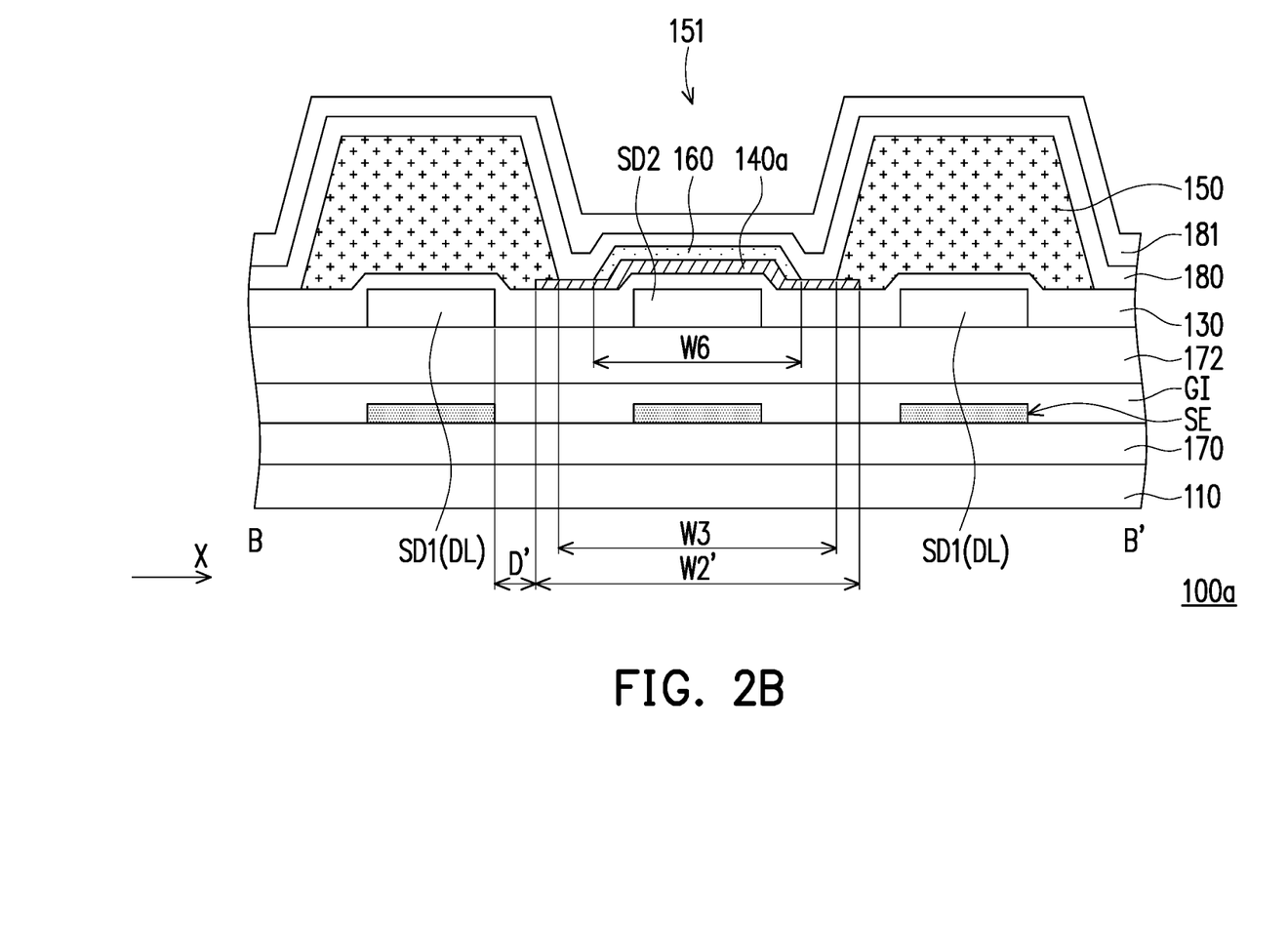
FIG. 2B is a schematic cross-sectional view of the display device of FIG. 2A taken along section line B-B'.

FIG. 2A is a schematic top view of a display device according to another embodiment. FIG. 2B is a schematic cross-sectional view of the display device of FIG. 2A taken along section line B-B'. Please refer to FIG. 1A and FIG. 2A at the same time. The display device 100a of this embodiment is substantially similar to the display device 100 of FIG. 1A, so the same and similar elements in the two embodiments will not be described here. The display device 100a of this embodiment differs from the display device 100 mainly in that the material of the transfer pad 140a of this embodiment may include a transparent conductive material, such as indium tin oxide, indium zinc oxide, indium oxide, zinc oxide, tin oxide, other suitable materials, or a combination of the above, but not limited thereto.

In detail, please refer to FIG. 2A. In the top view of the display device 100a, the transfer pad 140a of the display device 100a includes a first portion 143a corresponding to the first contact hole 131 and a second portion 144a corresponding to the second contact hole 151, wherein the width W1' of the first portion 143a is equal to the width W2' of the second portion 144a. Specifically, the first portion 143a and the second portion 144a of the transfer pad 140 of this embodiment may be located on different sides of the scan line SL, and the width W1' of the first portion 143a and the width W2' of the second portion 144a may be the same, forming a contour with a rectangular shape, but not limited thereto. The width W2' of the second portion 144a of the transfer pad 140a is larger than the width W3 of the second contact hole 151. Under the circumstances, the contour of the transfer pad 140a may be a rectangular shape, but not limited thereto. In this embodiment, the width W1' of the first portion 143a, the width W2' of the second portion 144a, and the width W3 of the second contact hole 151 are, for example, measured along the substantial extending direction (i.e., direction X) of the scan line SL.

Please refer to FIG. 2A and FIG. 2B at the same time. In this embodiment, since there is a distance D' between the transfer pad 140a and the source SD1 (DL), the parasitic capacitance between the transfer pad 140a and the source SD1 (DL) can be reduced, thereby decreasing the cross-talk between the transfer pad 140a and the source SD1. Additionally, further refer to FIG. 2B, in the cross-sectional view of the display device 100a, since the width W2' of the second portion 144a of the transfer pad 140a is larger than the width W3 of the second contact hole 151 and the orthographic projection of the transfer pad 140a on the substrate 110 may partially overlap the orthographic projection of the second insulating layer 150 on the substrate 110, the third insulating layer 180 in the second contact hole 151 may be formed between the pixel electrode 160 and the common electrode 181. In this manner, it is possible to avoid the risk of short circuit caused by the contact between the pixel electrode 160 and the common electrode 181. In this embodiment, the width W2' of the transfer pad 140a may also be greater than the width W6 of the pixel electrode 160, but not limited thereto. On the contrary, when the width W2' of the second portion 144a of the transfer pad 140a is smaller than the width W3 of the second contact hole 151 and the ortho-graphic projection of the transfer pad 140a on the substrate 110 does not partially overlap the orthographic projection of the second insulating layer 150 on the substrate 110, the third insulating layer 180 in the second contact hole 151 may be cracked, and consequently the pixel electrode 160 may contact the common electrode 181 and cause a short circuit. In this embodiment, the width W3 of the second contact hole 151, the width W2' of the transfer pad 140a, and the width W6 of the pixel electrode 160 are measured along the direction X, for example.

Figure 2C:
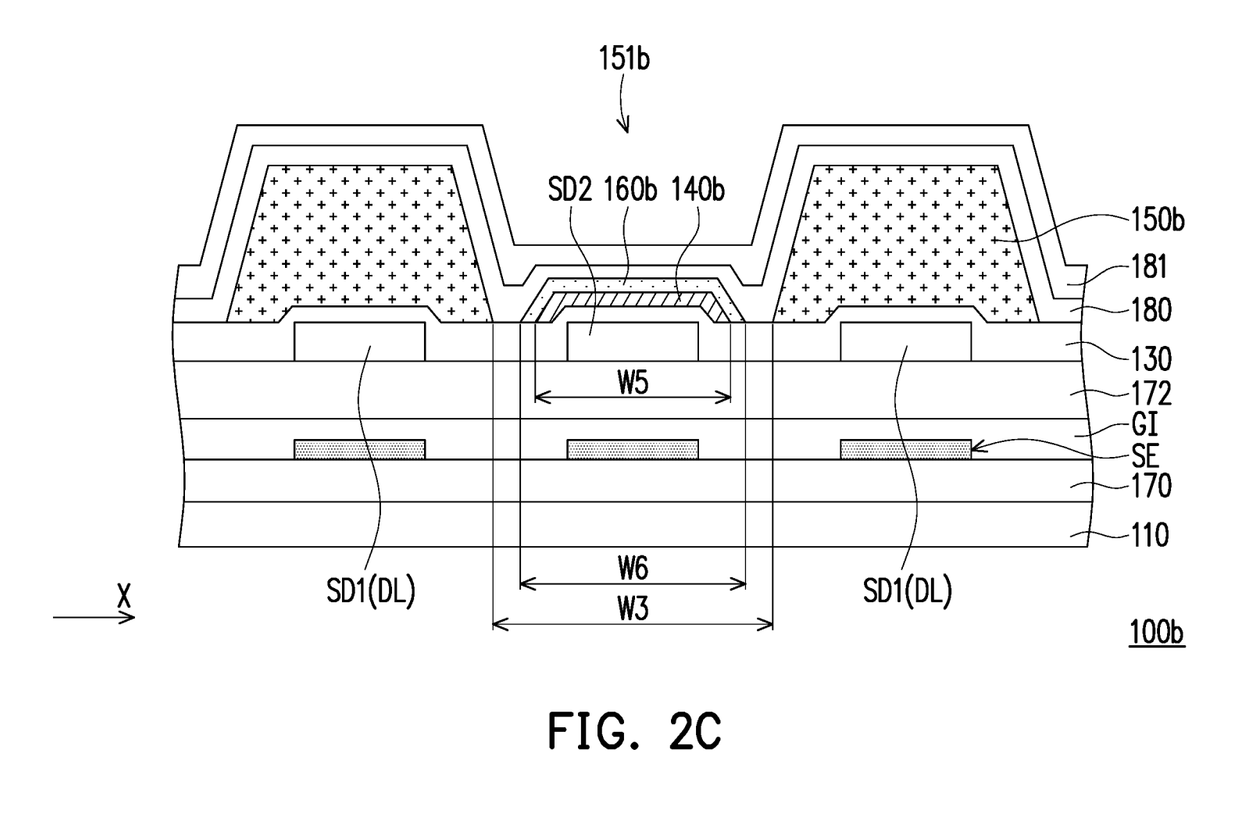
FIG. 2C is a schematic cross-sectional view of the display device of another embodiment of FIG. 2A taken along the section line B-B'.

FIG. 2C is a schematic cross-sectional view of the display device of another embodiment of FIG. 2A taken along the section line B-B'. Please refer to FIG. 2B and FIG. 2C at the same time, the display device 100b of this embodiment is substantially similar to the display device 100a of FIG. 2B, so the same and similar elements in the two embodiments will not be described here. The display device 100b of this embodiment differs from the display device 100a mainly in that, in the display device 100b of this embodiment, the width W5 of the transfer pad 140b is smaller than the width W3 of the second contact hole 151b of the second insulating layer 150b.

In detail, please refer to FIG. 2C, since the width W5 of the transfer pad 140b is smaller than the width W3 of the second contact hole 151b of the second insulating layer 150b, the distance between the transfer pad 140b and the source SD1 can be increased, thus further reducing the parasitic capacitance between the transfer pad 140b and the source SD1, and the cross-talk between the transfer pad 140b and the source SD1 can be further decreased. In addition, in the second contact hole 151b of the second insulating layer 150b, the width W5 of the transfer pad 140b may also be smaller than the width W6 of the pixel electrode 160b, but not limited thereto. In this embodiment, since the width W5 of the transfer pad 140b can be smaller than the width W6 of the pixel electrode 160b, the subsequently formed pixel electrode 160b and the third insulating layer 180 can be disposed on the transfer pad 140b, and the third insulating layer 180 can completely cover the transfer pad 140b and the pixel electrode 160b in the second contact hole 151b, but not limited thereto. In this embodiment, the width W3 of the second contact hole 151b, the width W5 of the transfer pad 140b, and the width W6 of the pixel electrode 160b are measured along the direction X, for example.

Figure 2D:
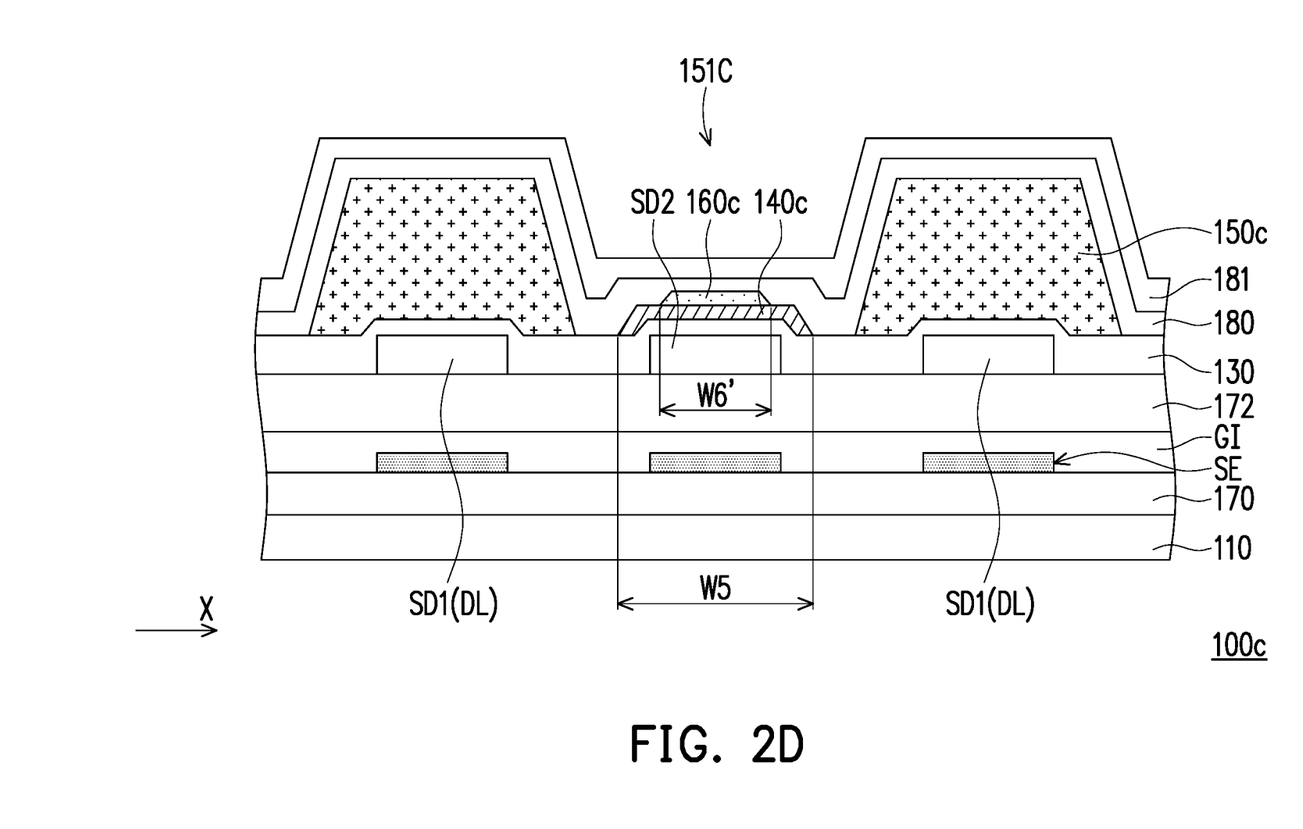
FIG. 2D is a schematic cross-sectional view of the display device of another embodiment of FIG. 2A taken along section line B-B'.

FIG. 2D is a schematic cross-sectional view of the display device of another embodiment of FIG. 2A taken along section line B-B'. Referring to FIG. 2C and FIG. 2D at the same time, the display device 100c of this embodiment is substantially similar to the display device 100b of FIG. 2C, so the same and similar elements in the two embodiments will not be repeated here. The display device 100c of this embodiment is different from the display device 100b mainly in that, in the second contact hole 151c of the second insulating layer 150c of the display device 100c of this embodiment, the width W5 of the transfer pad 140c is larger than the width W6' of the pixel electrode 160c. In this embodiment, the width W5 of the transfer pad 140c and the width W6' of the pixel electrode 160c are measured along the direction X, for example.

Figure 3A:
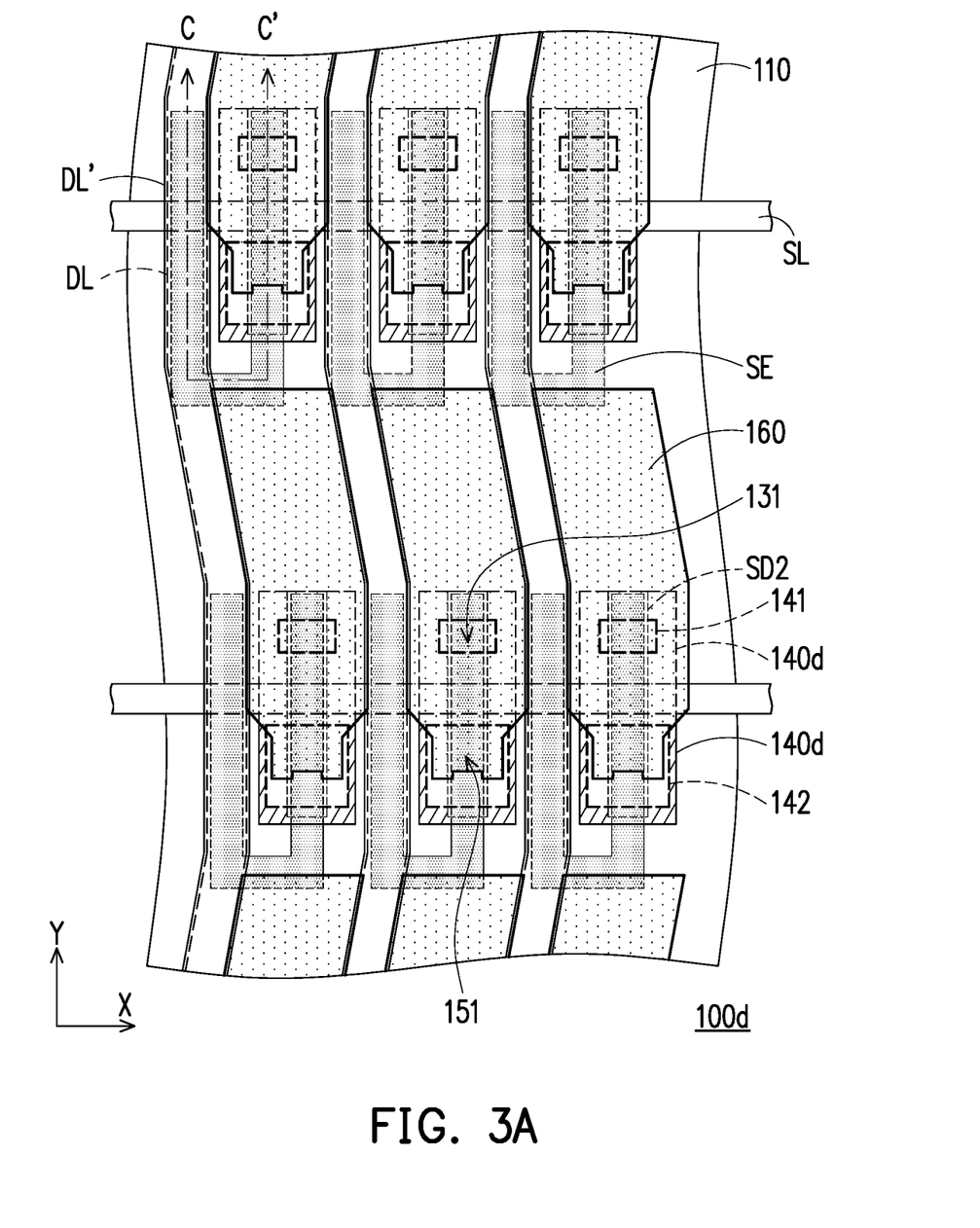
FIG. 3A is a schematic top view of a display device according to another embodiment.
Figure 3B:
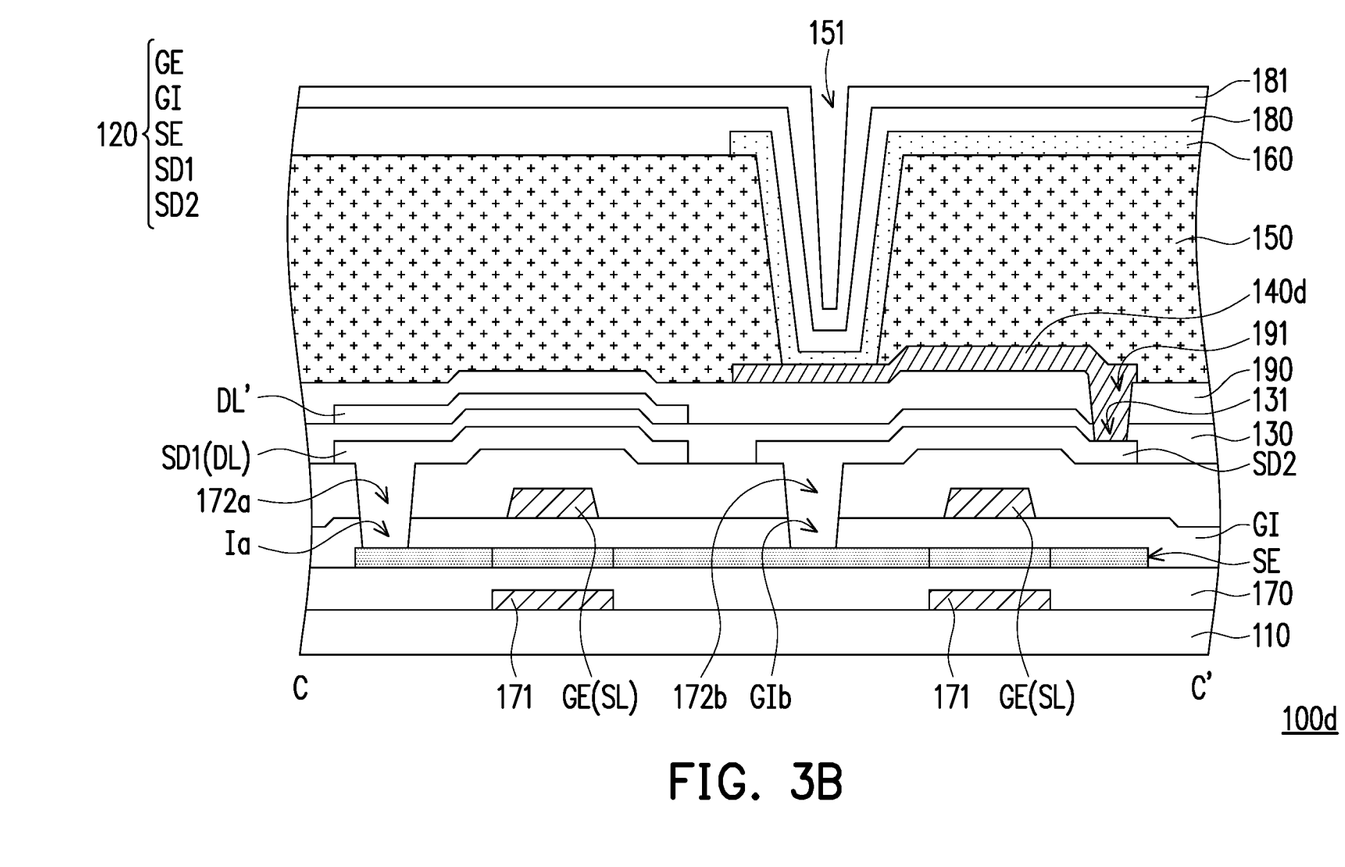
FIG. 3B is a schematic cross-sectional view of the display device of FIG. 3A taken along section line C-C'.

FIG. 3A is a schematic top view of a display device according to another embodiment. FIG. 3B is a schematic cross-sectional view of the display device of FIG. 3A taken along section line C-C'. Please refer to FIG. 1B, FIG. 2A and FIG. 3A to FIG. 3B at the same time. The display device 100d of this embodiment is substantially similar to the display device 100 of FIG. 1B and the display device 100a of FIG. 2A, so the same and similar elements in the two embodiments are not described here. The display device 100*d* of this embodiment is different from the display devices 100 and 100*a* mainly in that the display device 100*d* of this embodiment further includes a read line DL' and a fourth insulating layer 190.

In detail, please refer to FIG. 3A and FIG. 3B at the same time. The read line DL' is disposed on the first insulating layer 130 and located between the fourth insulating layer 190 and the first insulating layer 130. The read line DL' is disposed corresponding to the source SD1 (read line DL). The orthographic projection of the read line DL' on the substrate 110 overlaps the orthographic projection of the source SD (read line DL) on the substrate 110. In this embodiment, the material of the read line DL' may include metal materials (e.g., aluminum, molybdenum, copper, silver, etc.), other suitable materials, or a combination of the foregoing, but not limited thereto.

The fourth insulating layer 190 is provided on the read line DL'. The fourth insulating layer 190 covers the read line DL' and the first insulating layer 130. The fourth insulating layer 190 and the transistor 120 are respectively disposed on opposite sides of the first insulating layer 130. The fourth insulating layer 190 includes a third contact hole 191, wherein the third contact hole 191 communicates with the first contact hole 131 to expose a part of the drain SD2.

The transfer pad 140*d* is disposed on the fourth insulating layer 190, and filled in the third contact hole 191 and the first contact hole 131. The transfer pad 140*d* is disposed between the second insulating layer 150 and the fourth insulating layer 190. The transfer pad 140*d* is disposed corresponding to the drain SD2. The orthographic projection of the transfer pad 140*d* on the substrate 110 overlaps the orthographic projection of the drain SD2 on the substrate 110, and the orthographic projection of the transfer pad 140 on the substrate 110 is greater than the orthographic projection of the drain SD2 on the substrate 110. In the top view of the display device 100*d* (as shown in FIG. 3A), the area of the transfer pad 140*d* is larger than the area of the drain SD2. In this embodiment, the material of the transfer pad 140*d* may include a transparent conductive material, such as indium tin oxide, indium zinc oxide, indium oxide, zinc oxide, tin oxide, other suitable materials, or a combination of the above, but not limited thereto.

In this embodiment, by setting the read line DL' on the source SD1 (read line DL) and making the read line DL' correspond to the source SD1 (read line DL), the display device 100*d* of this embodiment can be provided with double-layer read lines DL and DL'. Therefore, the display device 100*d* of this embodiment with the double-layer read lines DL and DL' can reduce the impedance through the electrical connection between DL and DL' (not shown), thereby enhancing the driving capability of panel. Specifically, in a display panel with a small pixel size, since the width of the read line is smaller than that of a display panel with a large pixel size, when it is desired to achieve a display panel of a small pixel size with high resolution, the loading of the read line of such display panel will be significantly higher than the loading of the read line of the display panel of a large pixel size, and consequently the loading of the read line is likely to be excessively high and the screen display will be abnormal. Therefore, according to the teaching of this embodiment, if the double-layer read lines are provided in a display panel with a small pixel size and the electrical connection design is applied to the double-layer read lines, the impedance can be reduced and the driving capability of panel can be increased. In this manner, the requirement for small pixel size and high resolution can be satisfied simultaneously. For example, in a virtual reality (VR) display panel with a small pixel size, when the display panel is driven at a screen refresh rate at a higher resolution (such as 3K, but not limited thereto) or the computer game requires the application of a screen refresh rate at a higher frequency (for example, greater than 60 Hz, but not limited thereto), the screen display is likely to be abnormal due to the excessively high loading of the read lines. Therefore, the double-layer read line design is required to reduce impedance and improve driving capability of the panel.

In summary, in the display device of the embodiment of the disclosure, because the pixel electrode can contact the second contact region of the transfer pad, and the first contact region of the transfer pad can contact the drain, the pixel electrode can be electrically connected to the drain through the second contact region and the first contact region of the transfer pad. In addition, since the second contact region of the transfer pad is larger than the first contact region, the contact area between the pixel electrode and the transfer pad can be increased. Therefore, the display device of this embodiment can increase the contact area between the pixel electrode and the transfer pad by setting the second contact region of the transfer pad, so that the pixel electrode can improve and stabilize the electron transmission between the pixel electrode and the drain through the second contact region of the transfer pad, and reduce the resistance between the pixel electrode and the drain to improve the display quality of high-pixel display devices.

Although the disclosure has been disclosed in the above embodiments, it is not intended to limit the disclosure, and those skilled in the art can make some modifications and refinements without departing from the spirit and scope of the disclosure. Therefore, the scope of the disclosure is subject to the definition of the scope of the appended claims.

What is claimed is:

1. An electronic device, comprising:
    a substrate;
    a scan line disposed on the substrate and extending in a first direction;
    a transistor disposed on the substrate and comprising a drain electrode and a semiconductor layer, wherein the drain electrode and the semiconductor layer are different layers;
    a first insulating layer disposed on the transistor and comprising a first contact hole;
    a pad disposed on the first insulating layer and adjacent to the scan line, wherein the pad contacts the drain electrode through the first contact hole;
    a second insulating layer disposed on the pad and comprising a second contact hole; and
    an electrode disposed on the second insulating layer and contacting the pad through the second contact hole;
    wherein the pad overlaps the first contact hole and the second contact hole continuously in a direction different from the first direction,
    wherein the semiconductor layer has a U-shaped portion,
    wherein there is a distance between the first contact hole and the second contact hole in a top view of the electronic device, and the distance is greater than zero,
    wherein the first contact hole and the second contact hole are respectively disposed on two opposite sides of the scan line in the top view of the electronic device.

2. The electronic device according to claim 1, wherein an area of the pad is larger than an area of the drain electrode.

3. The electronic device according to claim 1, wherein in a top view of the electronic device, the first contact hole does not overlap the second contact hole.

4. The electronic device according to claim 1, wherein the pad comprises a metal material.

5. The electronic device according to claim 1, wherein the semiconductor layer has a bent portion.

6. The electronic device according to claim 1, further comprising a data line extending in the direction perpendicular to the first direction, wherein a portion of the semiconductor layer is overlapped with the data line.

7. The electronic device according to claim 1, wherein the semiconductor layer comprises a material of amorphous silicon, polysilicon, or metal oxide.

8. The electronic device according to claim 1, wherein the transistor has a top gate structure.

* * * * *